(12) United States Patent
Teysseyre et al.

(10) Patent No.: US 11,004,777 B2
(45) Date of Patent: May 11, 2021

(54) SEMICONDUCTOR DEVICE ASSEMBLIES

(71) Applicant: SEMICONDUCTOR COMPONENTS INDUSTRIES, LLC, Phoenix, AZ (US)

(72) Inventors: Jerome Teysseyre, Scottsdale, AZ (US); Chung-Lin Wu, San Jose, CA (US); Bigildis Dosdos, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/456,161

(22) Filed: Jun. 28, 2019

(65) Prior Publication Data

US 2020/0411421 A1    Dec. 31, 2020

(51) Int. Cl.
*H01L 23/495* (2006.01)
*H01L 23/00* (2006.01)
*H01L 23/31* (2006.01)

(52) U.S. Cl.
CPC .... *H01L 23/49568* (2013.01); *H01L 23/3107* (2013.01); *H01L 23/49524* (2013.01); *H01L 23/49575* (2013.01); *H01L 24/40* (2013.01); *H01L 24/48* (2013.01); *H01L 24/73* (2013.01); *H01L 2224/40137* (2013.01); *H01L 2224/40245* (2013.01); *H01L 2224/48091* (2013.01); *H01L 2224/48245* (2013.01); *H01L 2224/73221* (2013.01)

(58) Field of Classification Search
CPC .............. H01L 23/49568; H01L 24/48; H01L 23/49575; H01L 2224/73221
See application file for complete search history.

(56) References Cited

U.S. PATENT DOCUMENTS

| | | | |
|---|---|---|---|
| 2009/0001599 A1 | 1/2009 | Foong et al. | |
| 2010/0133670 A1 | 6/2010 | Liu et al. | |
| 2012/0098117 A1* | 4/2012 | Sato | H01L 23/49562 257/707 |
| 2014/0154843 A1 | 6/2014 | Liu et al. | |
| 2014/0301039 A1* | 10/2014 | Otremba | H01L 21/565 361/689 |
| 2016/0148859 A1* | 5/2016 | Muto | H01L 23/544 257/676 |
| 2018/0040541 A1* | 2/2018 | Choi | H01L 23/49568 |

* cited by examiner

*Primary Examiner* — Quoc D Hoang
(74) *Attorney, Agent, or Firm* — Brake Hughes Bellermann LLP

(57) ABSTRACT

In one general aspect, an apparatus can include a leadframe including a plurality of leads configured to provide electrical connections for the apparatus. The apparatus can also include a semiconductor die disposed on the leadframe and a conductive clip electrically coupling the semiconductor die with the leadframe. The apparatus can further include a heat slug disposed on the conductive clip. The heat slug can include a thermally conductive and electrically insulative material.

22 Claims, 13 Drawing Sheets

US 11,004,777 B2

SEMICONDUCTOR DEVICE ASSEMBLIES

TECHNICAL FIELD

This description generally relates to semiconductor device assemblies, such as such as semiconductor device packages or modules with dual-side cooling.

BACKGROUND

In general, metal (e.g., copper) heat slugs can be included in semiconductor device assemblies (e.g., package or module) to conduct heat produced (during operation) by one or more semiconductor die (or other electronic components) included in the semiconductor assembly to a surrounding (external) environment of the assembly, such as to a heat sink, cooling jacket, etc. that can be coupled with assembly. However, such metal (copper) heat slugs can have certain drawbacks. For instance, a metal heat slug can electrically connect (e.g., electrically short) to the semiconductor die (e.g., to electrical nodes of the semiconductor device assembly), such as through a conductive clip on which the heat slug can be disposed. Such electrical connections between the heat slug and the semiconductor die can cause electrical shorts between the semiconductor die and other components in a related electrical system, which is undesirable. Further, an area (e.g., externally exposed area) of a metal heat slug may be limited to prevent undesired electrical connections (e.g., electrical shorts) within a semiconductor device assembly (e.g., due to interference with wire bonds, etc.), which can, in turn, limit the thermal dissipation capabilities of the assembly.

SUMMARY

In one general aspect, an apparatus can include a leadframe including a plurality of leads configured to provide electrical connections for the apparatus. The apparatus can also include a semiconductor die disposed on the leadframe and a conductive clip electrically coupling the semiconductor die with the leadframe. The apparatus can further include a heat slug disposed on the conductive clip. The heat slug can include a thermally conductive and electrically insulative material.

In another general aspect, an apparatus can include a leadframe including a plurality of leads configured to provide electrical connections for the apparatus. The apparatus can also include a semiconductor die disposed on the leadframe, a first conductive clip electrically coupling the semiconductor die with the leadframe, and a second conductive clip electrically coupling the semiconductor die with the leadframe. The apparatus can further include a wire bond electrically coupling the semiconductor die with a lead of the plurality of leads of the leadframe. The apparatus can also further include a heat slug disposed on the first conductive clip and the second conductive clip. The heat slug can include a thermally conductive and electrically insulative material. The semiconductor die can be arranged in a plane, and a line orthogonal to the plane can intersect the leadframe, the semiconductor die, the wire bond and the heat slug.

In another general aspect, an apparatus can include a leadframe including a plurality of leads configured to provide electrical connections for the apparatus. The apparatus can also include a first semiconductor die disposed on the leadframe, a second semiconductor die disposed on the leadframe, and a conductive clip electrically coupling the first semiconductor die with the second semiconductor die and the leadframe. The apparatus can further include a heat slug disposed on the conductive clip. The heat slug can include a thermally conductive and electrically insulative material.

The details of one or more implementations are set forth in the accompanying drawings and the description below. Other features will be apparent from the description and drawings, and from the claims.

DETAILED DESCRIPTION

A semiconductor device assembly (e.g., semiconductor device package, module assembly, assembly, multi-chip module (MCM), etc.), such as those described herein, can include a leadframe, one or more semiconductor die, wire bonds between the semiconductor die and/or the leadframe, one or more conductive clips, and a thermally conductive, electrically insulative heat slug. In some implementations, the heat slug can include a ceramic material. In some implementations, the heat slug can be disposed on multiple conductive clips and the assembly can allow for dual sided cooling, e.g., via the leadframe on a first side of the assembly and via the heat slug on a second side of the assembly, opposite the first side of the assembly.

The example implementations described herein can overcome at least some of the drawbacks discussed above. For instance, use of an electrically insulative heat slug can prevent electrical shorts between semiconductor die of a semiconductor device assembly and other components in a related electrical system. Still further, an area (e.g., exposed area) of an electrically insulative heat slug can be increased, e.g., to bridge multiple conductive clips, which can improve thermal dissipation capabilities of a corresponding semiconductor device assembly.

Figure 1:
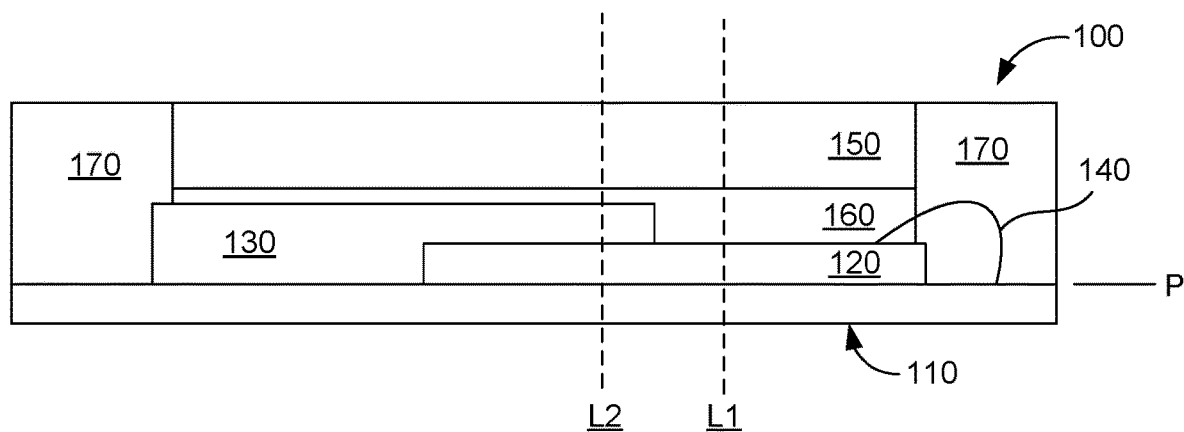
FIG. 1 is a diagram that schematically illustrates a semiconductor device assembly.

FIG. 1 is a diagram that schematically illustrates a semiconductor device assembly 100. The example implementation of FIG. 1 illustrates a schematic side view of the semiconductor device assembly (assembly) 100. It is noted that the aspects of the assembly 100 are given by way of example, and these aspects can also apply to the example implementations of the semiconductor device assemblies shown in FIGS. 2A through 5E.

As shown in FIG. 1, the assembly 100 can include a leadframe (baseframe, etc.) 110, a semiconductor die 120, a conductive clip 130, a wire bond 140, a thermally conductive and electrically insulative heat slug 150, an adhesive layer 160 and a molding compound 170. While not specifically shown in FIG. 1 the assembly 100 can include other elements such as respective solder or adhesive layers that can be used to couple the semiconductor die 120 to the leadframe 110 (e.g., to a die attach paddle of the leadframe 110) and to couple (e.g., electrically couple) the conductive clip 130 to the leadframe 110 and the semiconductor die 120.

In some implementations, such as those described herein, the leadframe 110 can include a plurality of leadframe portions, such as one or more die attach paddles and a plurality of leads (signal leads, power terminals, etc.). The leads can be configured to provide electrical connections for the apparatus. For instance, the leads can be configured to be coupled with, for example, a printed circuit board to provide electrical connections from the printed circuit board to the assembly 100 (e.g., to the semiconductor die 120 and/or other elements of the assembly 100). The conductive clip 130 and the wire bond 140 can then provide electrical connections between the semiconductor die 120 and the leadframe 110. In some implementations, additional semiconductor die 120, conductive clips 130 and/or wire bonds 140 can be included in the assembly 100, such as in the various implementations described herein. For instance, wire bonds 140 between different semiconductor die 120 can be included, conductive clips 130 can be coupled with, and provide electrical connections between different semiconductor die 120 and/or the leadframe 110, and so forth.

As shown in FIG. 1, the semiconductor die 120 can be disposed on the leadframe 110, the conductive clip 130 can be disposed on the leadframe 110 and the semiconductor die 120 and the heat slug 150 can be disposed on the conductive clip 130. In some implementations, such as the assembly 100, the heat slug 150 can extend (laterally extend) from the conductive clip 130 over the semiconductor die 120 and the wire bond 140. This can allow for increasing an area of the heat slug 150 exposed through the molding compound 170, as compared to current implementations, e.g., where a metal heat slug that does not extend beyond the conductive clip 130 is used. This increased exposed area can improve thermal dissipation performance of the assembly 100. For instance, in some implementations, reductions in thermal resistance (e.g., a junction to case thermal resistance) for a given semiconductor device assembly of 10 percent, 20 percent, or greater can be achieved.

In the assembly 100 (and other assemblies) the wire bond(s) 140 can be formed using low-loop wire bonding so that the heat slug 150 does not contact (interfere with, damage, etc.) the wire bond(s) 140. Further, in some implementations, the semiconductor die 120 can be thinned, e.g., using a backside grinding process, to provide clearance between the wire bond(s) 140 and the heat slug 150.

As shown in FIG. 1, the adhesive layer 160 can couple the heat slug 150 with the conductive clip 130. In some implementations, the adhesive layer 160 can be an adhesive film (e.g. a non-conductive film-on-wire adhesive film). As shown in FIG. 1, in such implementations, at least a portion of the wire bond 140 can, as a result of a curing (bake) process, become embedded in the adhesive layer 160.

As illustrated in FIG. 1, the molding compound 170 can at least partially encapsulate the apparatus 100. For instance, portions (surfaces) of the leadframe (such as the leads of the leadframe 110) and the heat slug 150 can be exposed through the molding compound. These exposed surfaces can provide for dual-side cooling of the apparatus 100, where heat produced during electrical operation of the assembly 100 can be dissipated through the leadframe 110 on a first side (e.g., bottom side) of the assembly 100 and through the heat slug 150 on a second side (e.g., top side) of the assembly 100. In some implementations, the heat slug 150 can be exposed through the molding compound 170 using a grinding process to remove molding compound from an upper surface of the heat slug 150, such as is further described below with respect to FIG. 6A.

As shown in FIG. 1, the semiconductor die 120 (which can be one of a plurality of semiconductor die of a semiconductor device assembly) can be arranged in (aligned in, define, etc.) a plane P. As also shown in FIG. 1, a first line L1 that is orthogonal to the plane P can intersect (e.g., intersect a vertical stack including) the leadframe 110, the semiconductor die 120, the wire bond 140 and the heat slug 150. In other words, the heat slug 150 can extend (laterally extend) from the conductive clip 130 over the semiconductor die 120 and the wire bond 140, as was noted above. As further shown in FIG. 1, a second line L2 that is also orthogonal to the plane P can intersect (e.g., intersect a vertical stack including) the leadframe 110, the semiconductor die 120, the conductive clip 130 and the heat slug 150. The example semiconductor device assemblies of FIGS. 2A through 5E can also have similar relationships between their leadframes, semiconductor die, conductive clips, wire bonds and heat slugs.

As noted above, FIGS. 2A through 5E illustrate example implementations of semiconductor device assemblies that can include aspects of the assembly 100 of FIG. 1. However, for purposes of brevity, these aspects may not be specifically discussed with respect to the example implementations of FIGS. 2A through 5E. Also, in FIGS. 2A through 5E, reference numbers for like or similar elements may not be shown for each of those elements. Also, reference numbers from one view of a given implementation may be not be repeated in the related views. Further, in some instances, for purposes of comparing different views, reference numbers from one view of given implementation may be repeated in other views, but may not be specifically discussed with respect to each view.

Figure 2A:
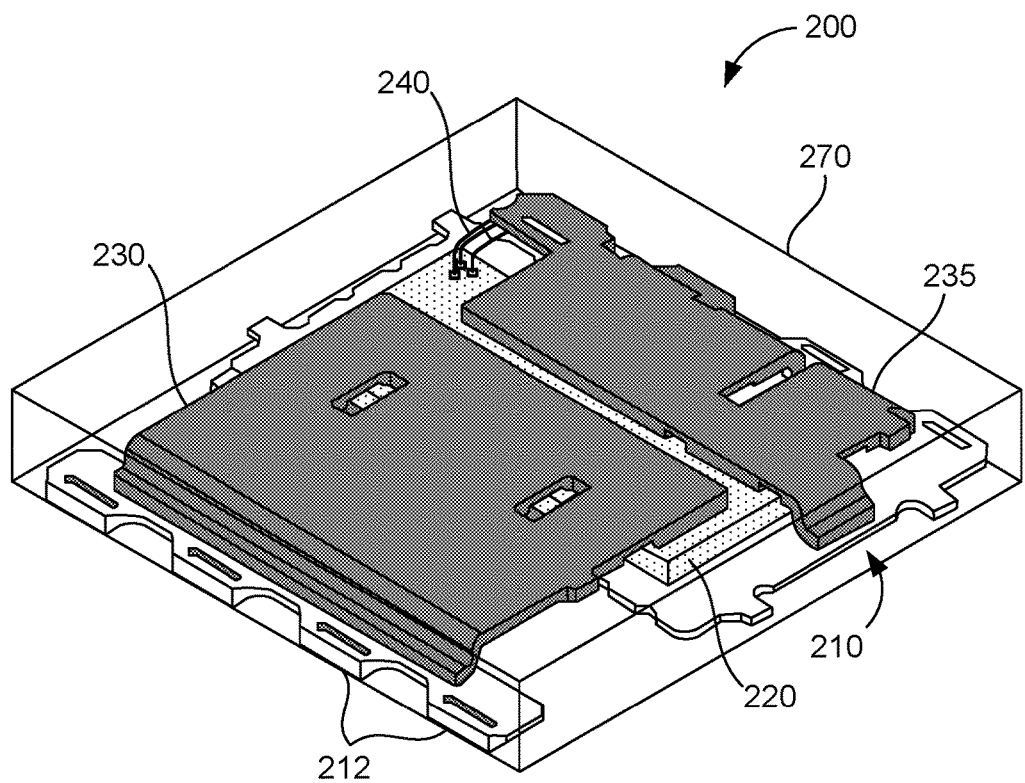
FIGS. 2A through 2E are diagrams that illustrate various views of a semiconductor device assembly.
Figure 2B:
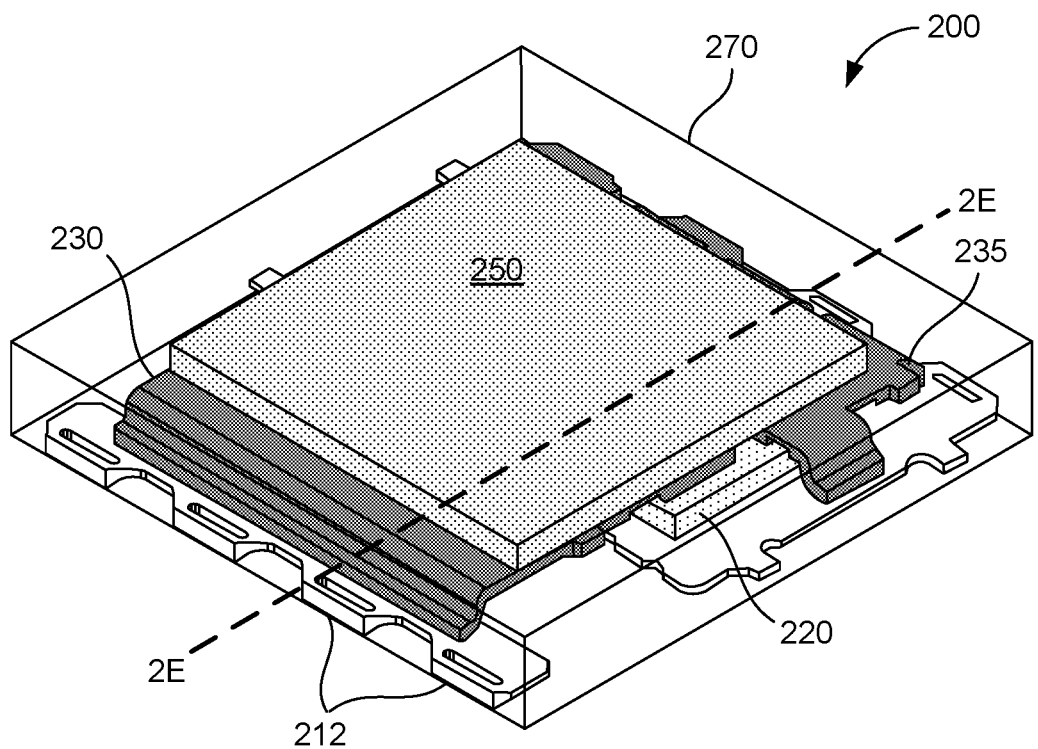
Figure 2C:
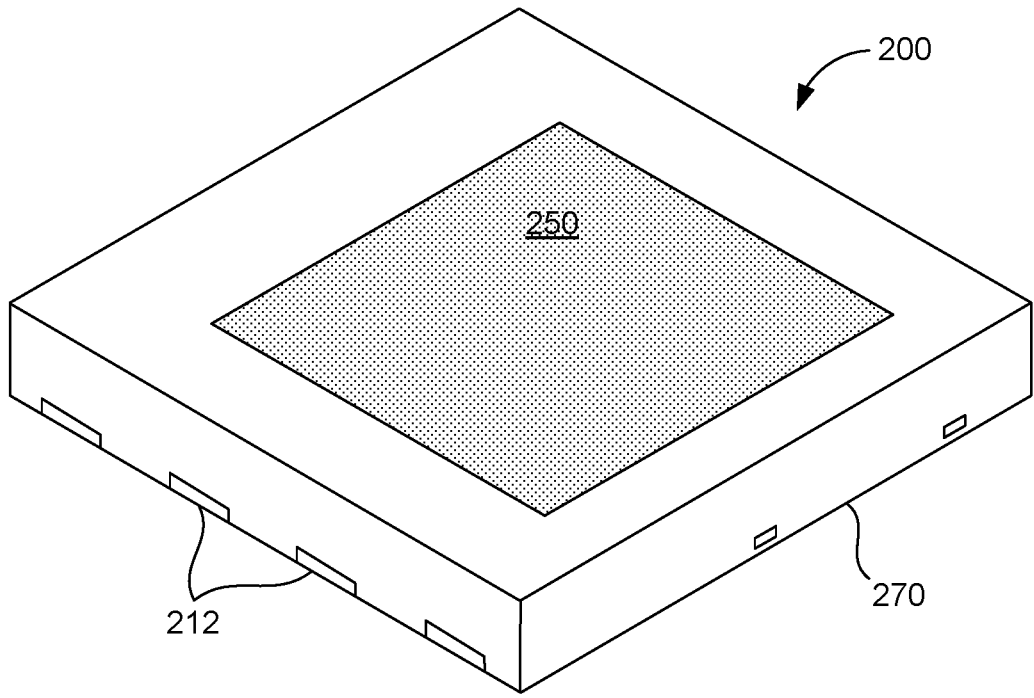
Figure 2D:
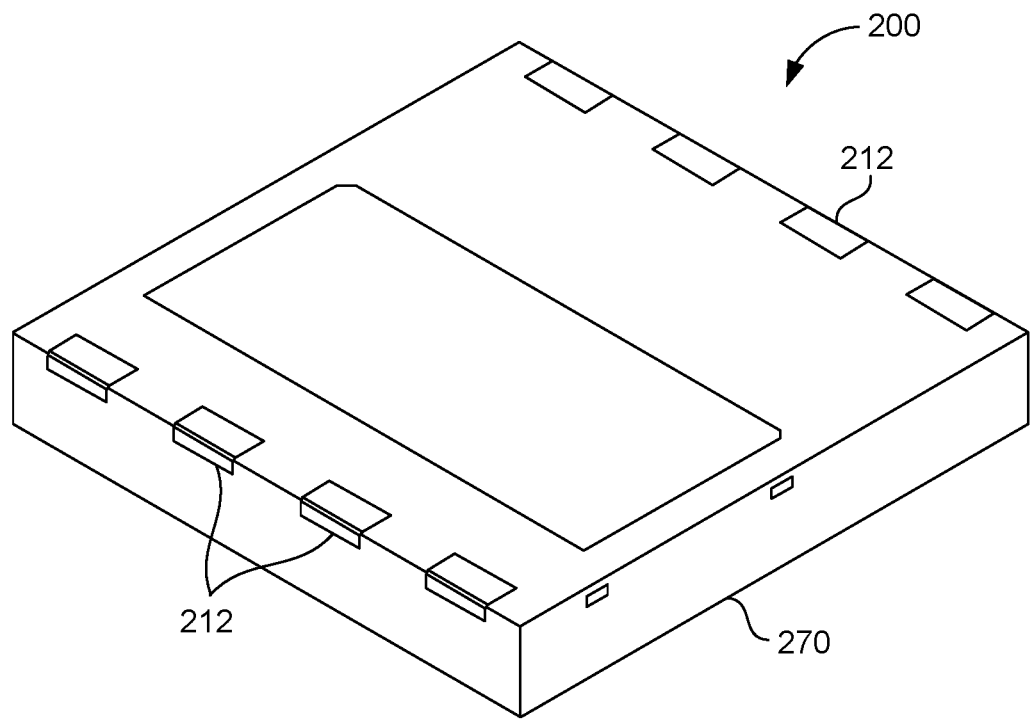
Figure 2E:
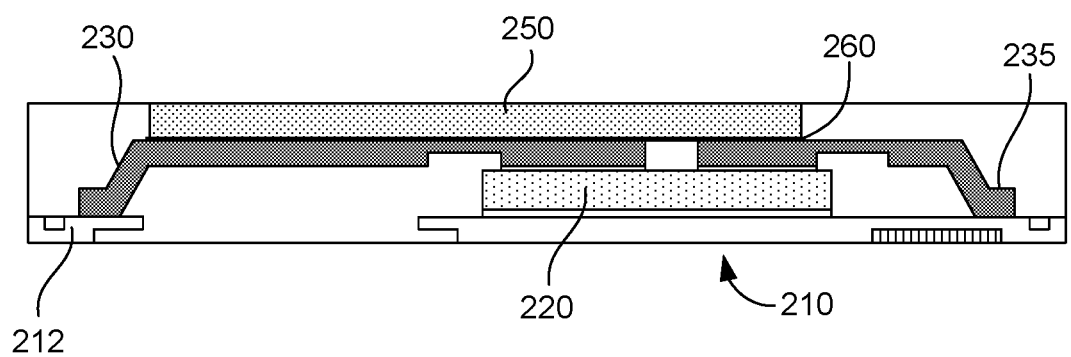

FIGS. 2A through 2E are diagrams that illustrate various views of a semiconductor device assembly 200. FIG. 2A is an isometric view of the assembly 200 without a heat slug to illustrate arrangement of elements of the assembly 400 (that are disposed under the heat slug). FIG. 2B is an isometric view of the assembly 200 with the heat slug included. In FIGS. 2A and 2B, a molding compound is indicated by outline (e.g., is shown as transparent), so that other elements of the assembly 200 disposed within the molding compound are visible in those views. FIG. 2C is an isometric view of the assembly 200 corresponding with the view of FIG. 2B, showing the molding compound as opaque. FIG. 2D is an isometric view illustrating a bottom side of the assembly 200 shown in FIG. 2C. FIG. 2E is a cross-sectional diagram of the assembly 200 along a section line 2E-2E shown in FIG. 2B, with the molding compound again illustrated by outline.

Referring to FIG. 2A, the assembly 200 includes a leadframe 210, a semiconductor die 220, conductive clips 230 and 235, wire bonds 240 and a molding compound 270. As noted above, a heat slug is not shown in FIG. 2A. The leadframe 210 can include multiple portions including a plurality of leads 212 that are configured to be coupled (electrically coupled) with a printed circuit board. As shown in FIG. 2A, the semiconductor die 220 (which can be a discrete power transistor) can be disposed on the leadframe 210. The conductive clips 230 and 235 can be disposed on (and electrically coupled with) the leadframe 210 and the semiconductor die 220. The conductive clips 230 and 235 can provide respective electrical connections between the leadframe 210 and the semiconductor die 220 (e.g., to a source and drain of a power transistor). As also shown in FIG. 2A, the wire bonds 240 can also provide electrical connections between the semiconductor die 220 and the leadframe 210 (e.g., to a gate of a power transistor). As further shown in FIG. 2A, a molding compound 270 (shown in outline) can encapsulate (partially encapsulate) the apparatus 200. For instance, portions (surfaces) of the leadframe 210 (such as the leads 212) can be exposed through the molding compound 270 to provide for establishing electrical connections to the semiconductor die 220.

Referring to FIG. 2B, the assembly 200 is illustrated with a thermally conductive and electrically insulative heat slug 250. In some implementations, the heat slug 250 (as well as the heat slugs of the other example implementations described herein) can include a ceramic material. For instance, in some implementations, the heat slug 250 can include at least one of aluminum oxide ($Al_2O_3$), aluminum nitride (AlN) and beryllium oxide (BeO). In some implementations, the heat slug 250 can include other thermally conductive and electrically insulative materials, such as diamond, silicon, silicon carbide, etc.

As shown in FIG. 2B, the heat slug 250 can be disposed on the conductive clips 230 and 235, and can extend (laterally extend) beyond the conductive clips 230 and 235 over (above, vertically above, etc.) the semiconductor die 220 and one or more of the wire bonds 240, in an arrangement (vertical arrangement) such as discussed above with respect to FIG. 1. In the assembly 200, a surface (upper surface) of the heat slug 250 can be exposed through the molding compound 270. In some implementations, a heat sink (or other thermal dissipation apparatus) can be disposed on the exposed surface of the heat slug 250, as well as heat slugs of other assemblies included in a corresponding electrical system. Because the heat slug 250 is electrically insulative, the heat slug 250 is not electrically connected to the conductive clips 230 and 235, preventing the risk of an electrical connection (electrical short) to the semiconductor die 220 through the heat slug 250. A section line 2E-2E is also shown in FIG. 2B, where the section line 2E-2E corresponds with the cross-sectional view of the assembly 200 shown in FIG. 2E.

Referring to FIG. 2C, the assembly 200 is illustrated with the molding compound 270 shown as opaque, as compared to the molding compound 270 being shown as transparent in FIGS. 2A and 2B. As illustrated in FIG. 2C, a surface (upper surface) of the heat slug 250 is exposed through the molding compound 270. Further, portions of the leadframe, such as surfaces of the leads 212 are also exposed through the molding compound 270. FIG. 2D shows a view of a bottom side of the assembly 200 (as compared with the view of FIG. 2C). As illustrated in FIG. 2D, portions of the leadframe, such as surface of the leads 212 are exposed through the molding compound 270. As described herein, the assembly 200 can provide for dual-sided cooling (thermal dissipation) through the leadframe on a first side of the assembly 200 and through the heat slug 250 on a second side of the assembly 200.

FIG. 2E, as indicated above, illustrates a cross-sectional view of the apparatus 200 along the section line 2E-2E in FIG. 2B. As shown in FIG. 2E, the semiconductor die 220 is disposed on the leadframe 210, the conductive clips 230 and 235 are disposed on the semiconductor die 220 and the leadframe 210 (e.g., on the leads 212), and the heat slug 250 is disposed on the conductive clips 230 and 235, with an adhesive layer 260 (e.g., epoxy, adhesive film, etc.) being disposed between the heat slug 250 and the conductive clips 230 and 235. As discussed herein, because the heat slug 250 is electrically insulative, the heat slug 250 can be disposed on (bridge) both conductive clips 230 and 235, with the conductive clips 230 and 235 remaining electrically isolated from one another. FIG. 2E also further illustrates encapsulation of the apparatus 200 by the molding compound 270, with a surface of the heat slug 250 and surfaces of the leadframe 210 being exposed through the molding compound 270.

Figure 3A:
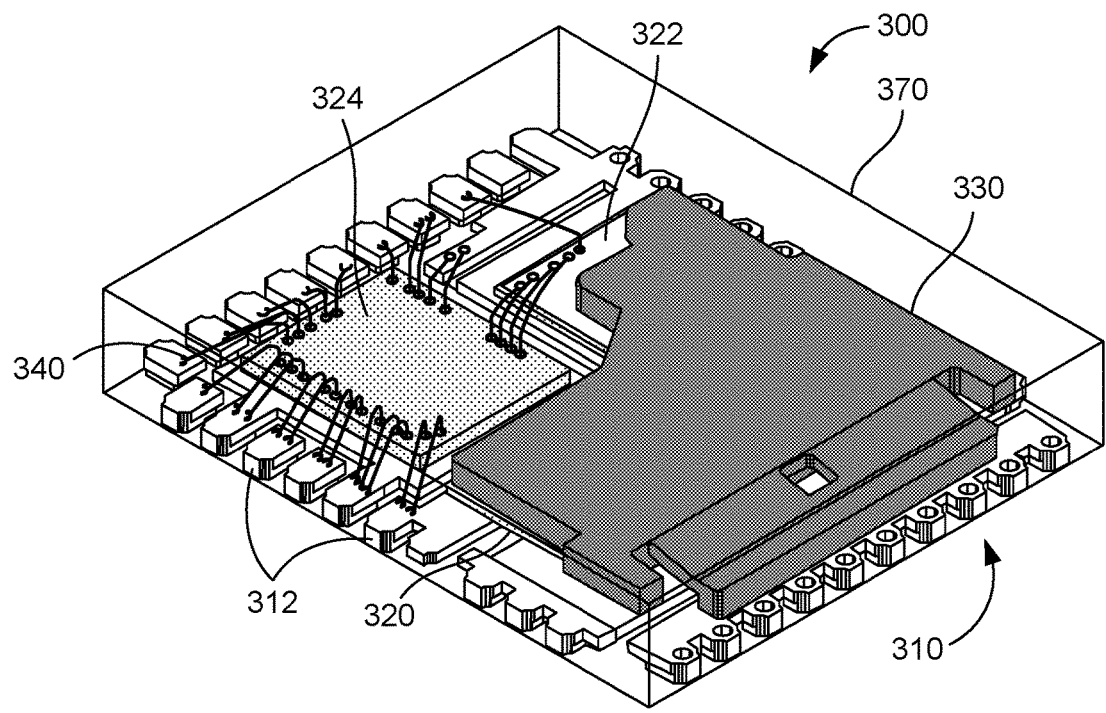
FIGS. 3A through 3F are diagrams that illustrate various views of another semiconductor device assembly.
Figure 3B:
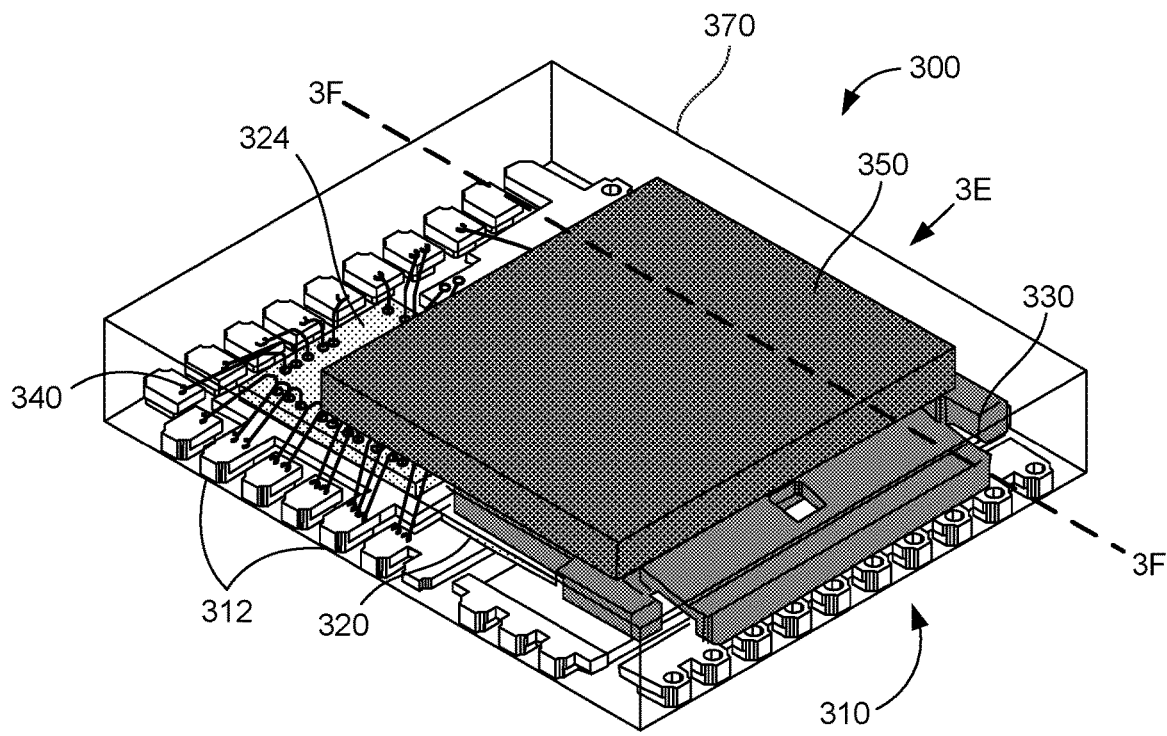
Figure 3C:
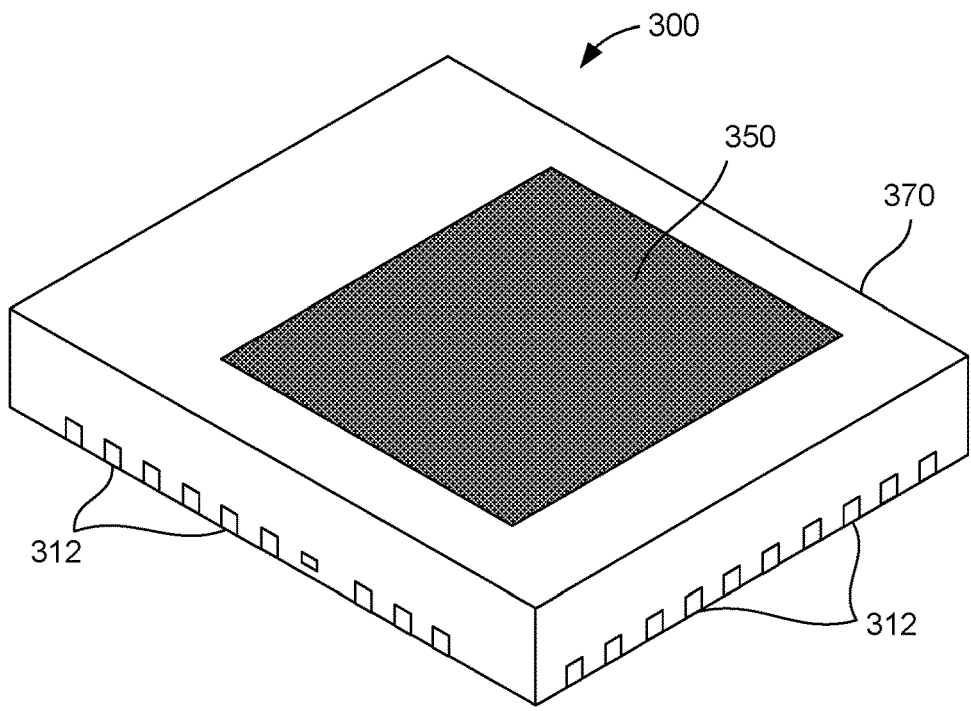
Figure 3D:
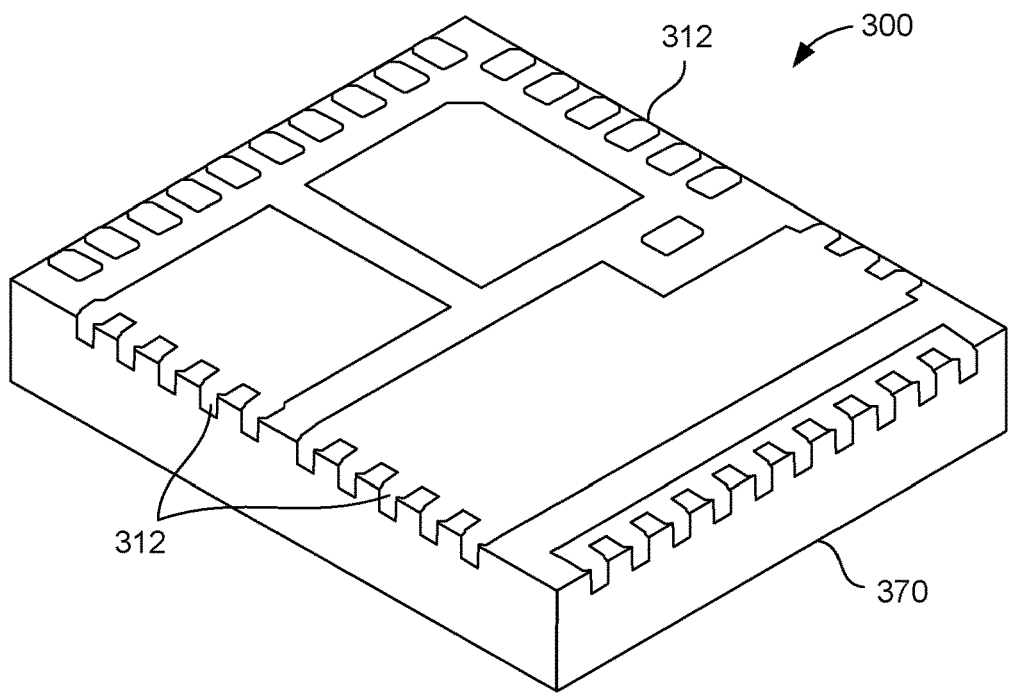
Figure 3E:
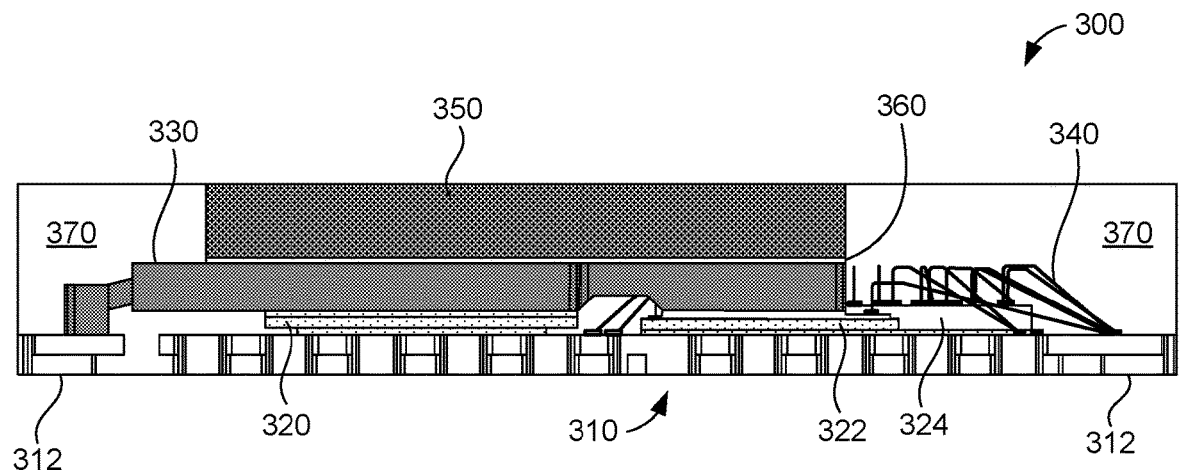
Figure 3F:
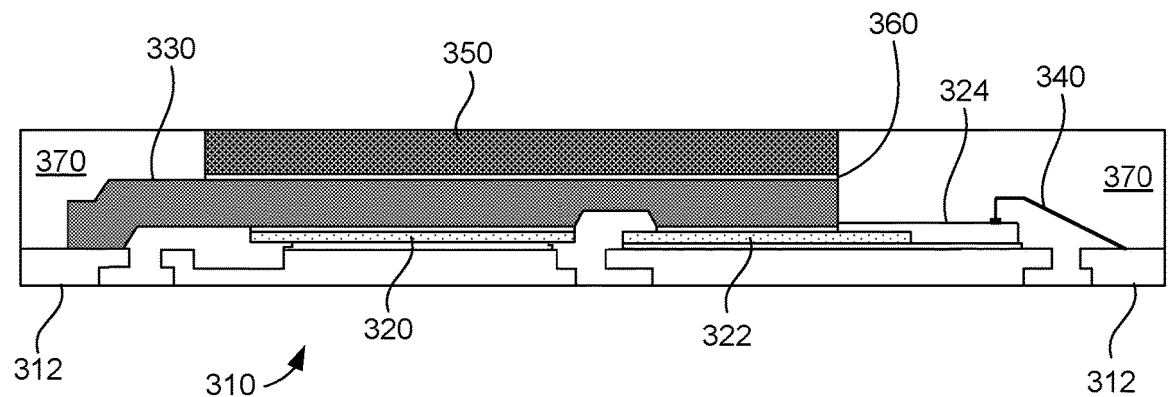

FIGS. 3A through 3F are diagrams that illustrate various views of a semiconductor device assembly 300. FIG. 3A is an isometric view of the assembly 300 without a heat slug to illustrate arrangement of elements of the assembly 400 (that are disposed under the heat slug). FIG. 3B is an isometric view of the assembly 300 with the heat slug included. As with FIGS. 2A and 2B, in FIGS. 3A and 3B, a molding compound is indicated by outline (e.g., transparent), so that other elements of the assembly 300 disposed within the molding compound are visible in those views. FIG. 3C is an isometric view of the assembly 300 corresponding with the view of FIG. 3B, showing the molding compound as opaque. FIG. 3D is an isometric view illustrating a bottom side of the assembly 300 shown in FIG. 3C. FIG. 3E is a side view of the assembly 300 along a direction 3E shown in FIG. 3B, with the molding compound again shown in outline. FIG. 3F is a cross-sectional diagram of the assembly 300 along a section line 3F-3F shown in FIG. 3B, with the molding compound illustrated by outline.

Referring to FIG. 3A, the assembly 300 includes a leadframe 310, semiconductor die 320, 322 and 324, conductive clip 330, wire bonds 340 and a molding compound 370. As noted above, a heat slug is not shown in FIG. 3A. The leadframe 310 can include multiple portions including a plurality of leads 312 that are configured to be coupled (electrically coupled) with a printed circuit board. As shown in FIG. 3A, the semiconductor die 320, 322 and 324 (which can implement a power transistor pair and an associated control circuit) can be disposed on the leadframe 310. The conductive clip 330 can be disposed on (and electrically coupled with) the leadframe 310 and the semiconductor die 320 and 322 (and not the semiconductor die 324). The conductive clip 330 can provide electrical connections between the leadframe 310 and the semiconductor die 320 and 322 (e.g., to a switching node of a power transistor pair). As also shown in FIG. 3A, the wire bonds 340 can also provide electrical connections between the semiconductor die 320, 322 and 324 and the leadframe 310. That is, the wire bonds 340 can provide semiconductor die to semiconductor die electrical connections, and semiconductor die to leadframe electrical connections.

As further shown in FIG. 3A, a molding compound 370 (shown in outline) can encapsulate (partially encapsulate) the apparatus 300. For instance, portions (surfaces) of the leadframe 310 (such as the leads 312) can be exposed through the molding compound 370 to provide for establishing electrical connections to the semiconductor die 320, 322 and 324.

Referring to FIG. 3B, the assembly 300 is illustrated with a thermally conductive and electrically insulative heat slug 350. In some implementations, as noted above, the heat slug 350 can include a ceramic material. For instance, in some implementations, the heat slug 350 can include at least one of $Al_2O_3$, AN and BeO. In some implementations, the heat slug 350 can include other thermally conductive and electrically insulative materials.

As shown in FIG. 3B, the heat slug 350 can be disposed on the conductive clip 330, and can extend (laterally extend)

beyond the conductive clip 330 over (above, vertically above, etc.) the semiconductor die 320, 322 and 324 and one or more of the wire bonds 340, as in an arrangement (vertical arrangement) such as discussed above with respect to FIG. 1. In the assembly 300, a surface (upper surface) of the heat slug 350 can be exposed through the molding compound 370. In some implementations, a heat sink (or other thermal dissipation apparatus) can be disposed on the exposed surface of the heat slug 350, as well as heat slugs of other assemblies included in a corresponding electrical system. Because the heat slug 350 is electrically insulative, the heat slug 350 is not electrically connected to the conductive clip 330, preventing the risk of an electrical connection (electrical short) to the semiconductor die 320 and 322 through the heat slug 350.

A direction line 3E is shown in FIG. 3B, where the direction line 3E corresponds with the side view of the assembly 300 shown in FIG. 3E. A section line 3F-3F is also shown in FIG. 3B, where the section line 3F-3F corresponds with the cross-sectional view of the assembly 300 shown in FIG. 3F.

Referring to FIG. 3C, the assembly 300 is illustrated with the molding compound 370 shown as opaque, as compared to the molding compound 370 being shown as transparent in FIGS. 3A and 3B. As illustrated in FIG. 3C, a surface (upper surface) of the heat slug 350 is exposed through the molding compound 370. Further, portions of the leadframe, such as surfaces of the leads 312 are also exposed through the molding compound 370. FIG. 3D shows a view of a bottom side of the assembly 300 (as compared with the view of FIG. 3C). As illustrated in FIG. 3D, portions of the leadframe, such as surface of the leads 312 are exposed through the molding compound 370. As described herein, the assembly 300 can provide for dual-sided cooling (thermal dissipation) through the leadframe on a first side of the assembly 300 and through the heat slug 350 on a second side of the assembly 300.

FIG. 3E, as indicated above, illustrates a side view of the apparatus 300 along the direction line 3E in FIG. 3B. As shown in FIG. 3E, the semiconductor die 320, 322 and 324 are disposed on the leadframe 310, the conductive clip 330 is disposed on the semiconductor die 320 and 322 and the leadframe 310 (e.g., on the leads 312), and the heat slug 350 is disposed on the conductive clip 330, with an adhesive layer 360 (e.g., epoxy, adhesive film, etc.) being disposed between the heat slug 350 and the conductive clip 330. FIG. 3E also further illustrates encapsulation of the apparatus 300 by the molding compound 370, with a surface of the heat slug 350 and surfaces of the leadframe 310 being exposed through the molding compound 370.

FIG. 3F, as indicated above, illustrates a cross-sectional view of the apparatus 300 along the section line 3F-3F in FIG. 3B. As shown in FIG. 3F, similarly to FIG. 3E, the semiconductor die 320, 322 and 324 are disposed on the leadframe 310, the conductive clip 330 is disposed on the semiconductor die 320 and 322 and the leadframe 310 (e.g., on the leads 312), and the heat slug 350 is disposed on the conductive clip 330, with the adhesive layer 360 being disposed between the heat slug 350 and the conductive clip 330. FIG. 3F, similarly to FIG. 3E, also further illustrates encapsulation of the apparatus 300 by the molding compound 370, with a surface of the heat slug 350 and surfaces of the leadframe 310 being exposed through the molding compound 370.

Figure 4A:
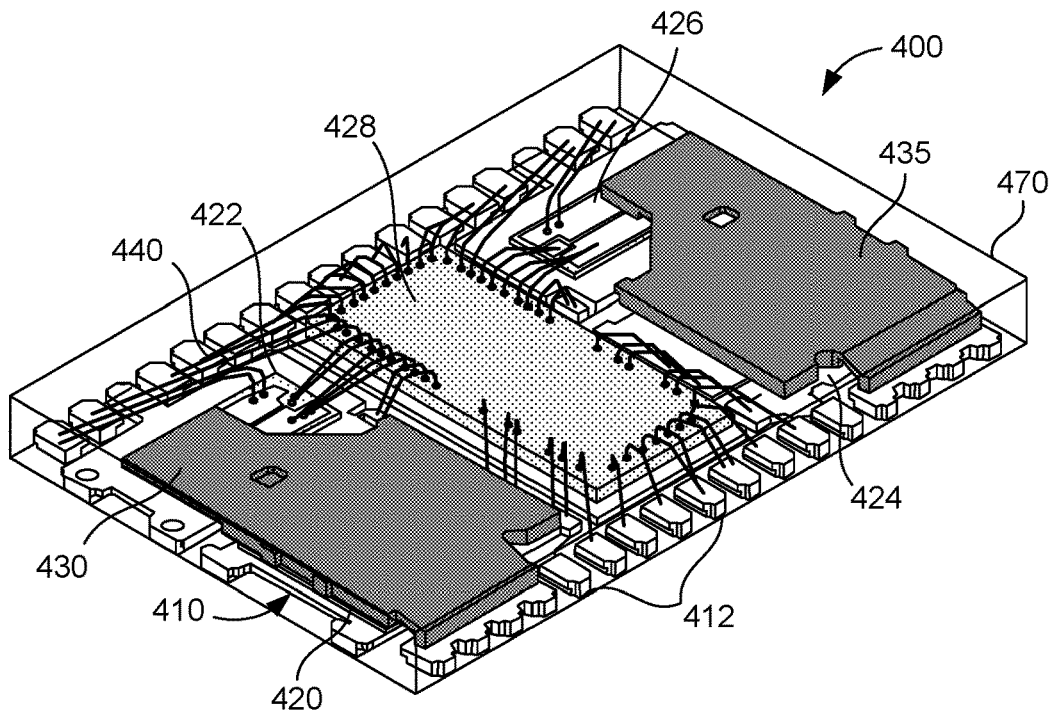
FIGS. 4A through 4E are diagrams that illustrate various views of another semiconductor device assembly.
Figure 4B:
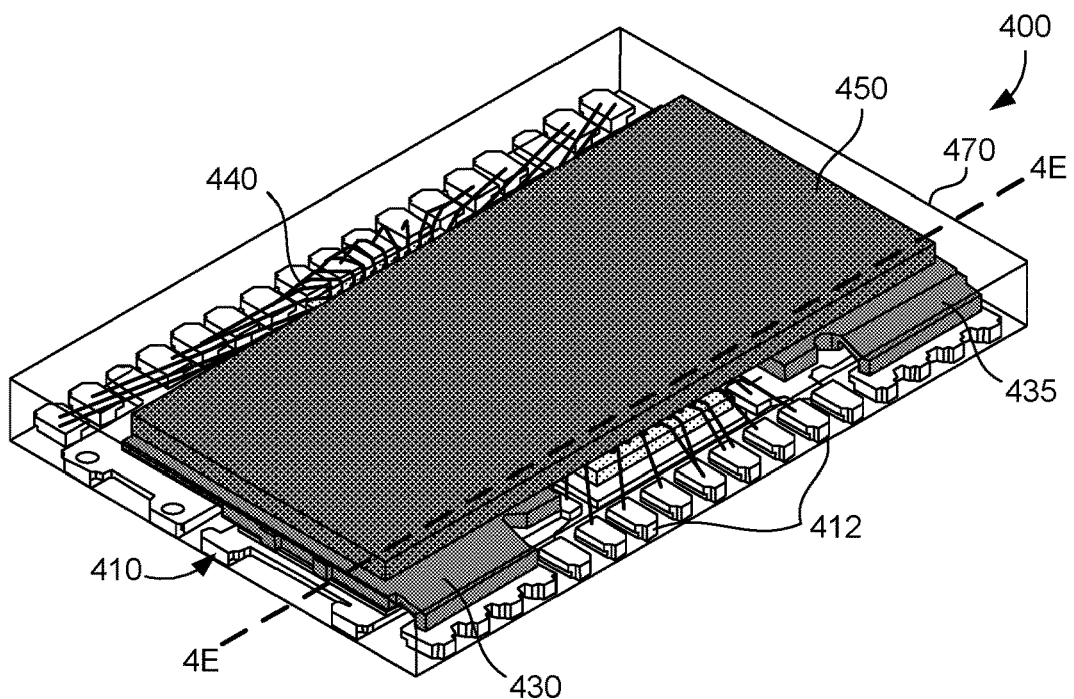
Figure 4C:
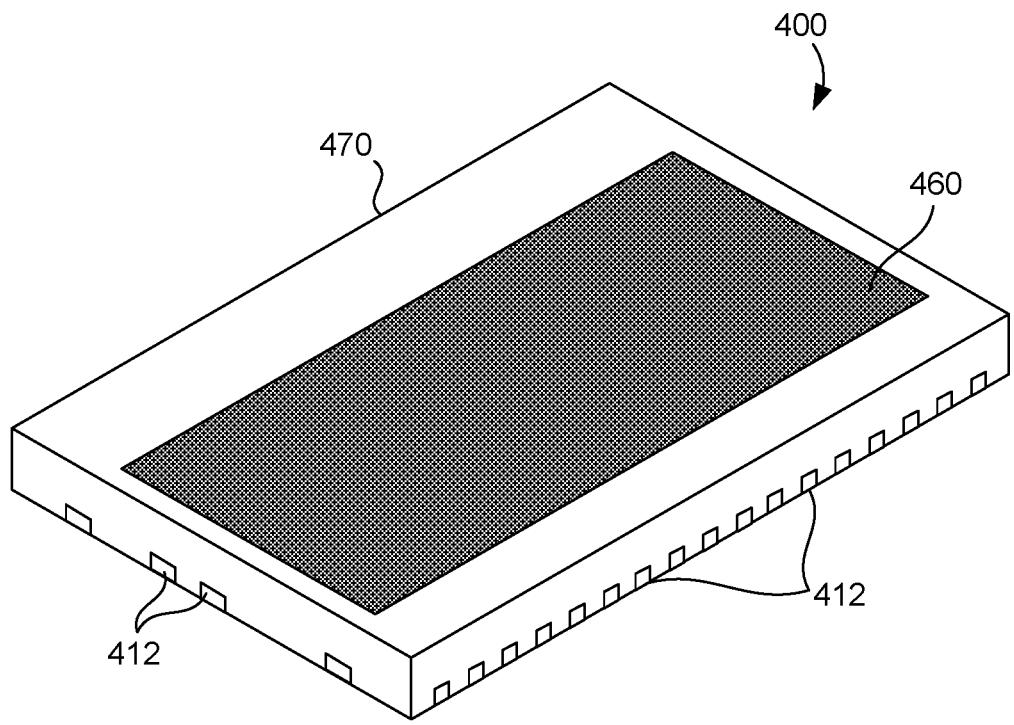
Figure 4D:
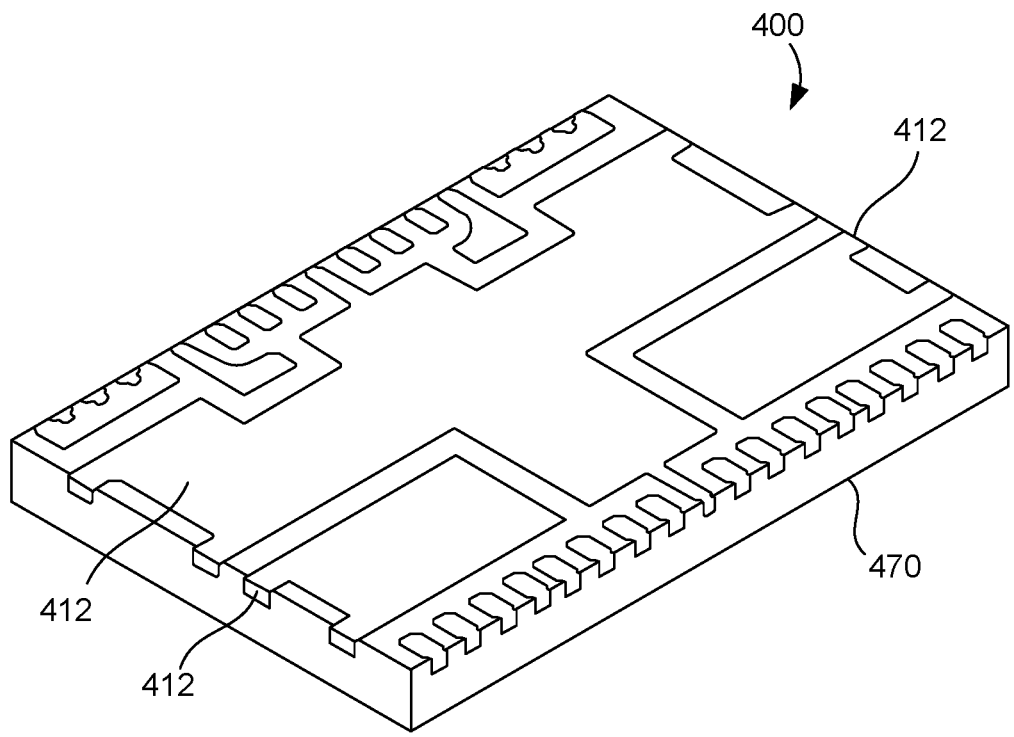
Figure 4E:
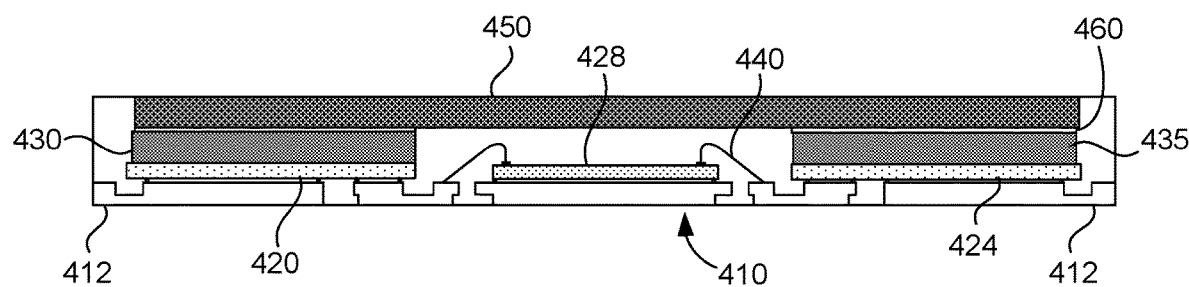

FIGS. 4A through 4E are diagrams that illustrate various views of a semiconductor device assembly 400. FIG. 4A is an isometric view of the assembly 400 without a heat slug to illustrate arrangement of elements of the assembly 400 (that are disposed under the heat slug). FIG. 4B is an isometric view of the assembly 400 with the heat slug included. As with FIGS. 2A, 2B, 3A and 3B, in FIGS. 4A and 4B, a molding compound is indicated by outline (e.g., transparent) only, so that the elements of the assembly 400 disposed within the molding compound are visible in those views. FIG. 4C is an isometric view of the assembly 400 corresponding with the view of FIG. 4B, showing the molding compound as opaque. FIG. 4D is an isometric view illustrating a bottom side of the assembly 400 shown in FIG. 4C. FIG. 4E is a cross-sectional diagram of the assembly 400 along a section line 4E-4E in FIG. 4B, with the molding compound illustrated by outline.

Referring to FIG. 4A, the assembly 400 includes a leadframe 410, semiconductor die 420, 422, 424, 426 and 428, conductive clips 430 and 435, wire bonds 440 and a molding compound 470. As noted above, a heat slug is not shown in FIG. 4A. The leadframe 410 can include multiple portions including a plurality of leads 412 that are configured to be coupled (electrically coupled) with a printed circuit board. As shown in FIG. 4A, the semiconductor die 420, 422, 424, 426 and 428 (which can implement a dual-phase controller) can be disposed on the leadframe 410. The conductive clip 430 can be disposed on (and electrically coupled with) the leadframe 410 and the semiconductor die 420 and 422. The conductive clip 430 can provide electrical connections between the leadframe 410 and the semiconductor die 420 and 422. The conductive clip 435 can be disposed on (and electrically coupled with) the leadframe 410 and the semiconductor die 424 and 426. The conductive clip 435 can provide electrical connections between the leadframe 410 and the semiconductor die 424 and 426. In the assembly 400, the semiconductor die 428 may not be contacted by (coupled with) a conductive clip. As also shown in FIG. 4A, the wire bonds 440 can also provide electrical connections between the semiconductor die 420, 422, 424, 426 and 428 and the leadframe 410. That is, the wire bonds 440 can provide semiconductor die to semiconductor die electrical connections, and semiconductor die to leadframe electrical connections.

As further shown in FIG. 4A, a molding compound 470 (shown in outline) can encapsulate (partially encapsulate) the apparatus 400. For instance, portions (surfaces) of the leadframe 410 (such as the leads 412) can be exposed through the molding compound 470 to provide for establishing electrical connections to the semiconductor die 420, 422, 424, 426 and 428.

Referring to FIG. 4B, the assembly 400 is illustrated with a thermally conductive and electrically insulative heat slug 450. In some implementations, as discussed above, the heat slug 450 can include a ceramic material. For instance, in some implementations, the heat slug 450 can include at least one of $Al_2O_3$, AN and BeO. In some implementations, the heat slug 450 can include other thermally conductive and electrically insulative materials.

As shown in FIG. 4B, the heat slug 450 can be disposed on the conductive clips 430 and 435, and can extend (laterally extend) beyond the conductive clips 430 and 435 over (above, vertically above, etc.) the semiconductor die 420, 422, 424, 426 and 428 and one or more of the wire bonds 440, in an arrangement (vertical arrangement) such as discussed above with respect to FIG. 1. In the assembly 400, a surface (upper surface) of the heat slug 450 can be exposed through the molding compound 470. In some implementations, a heat sink (or other thermal dissipation apparatus) can be disposed on the exposed surface of the heat slug 450, as well as heat slugs of other assemblies included in a corresponding electrical system. Because the heat slug 450 is electrically insulative, the heat slug 450 is not electrically connected to the conductive clips 430 and 435, preventing the risk of an electrical connection (electrical short) to the semiconductor die 420, 422, 424 and 426 through the heat slug 450. A section line 4E-4E is also shown in FIG. 4B, where the section line 4E-4E corresponds with the cross-sectional view of the assembly 400 shown in FIG. 4E.

Referring to FIG. 4C, the assembly 400 is illustrated with the molding compound 470 shown as opaque, as compared to the molding compound 470 being shown as transparent in FIGS. 4A and 4B. As illustrated in FIG. 4C, a surface (upper surface) of the heat slug 450 is exposed through the molding compound 470. Further, portions of the leadframe, such as surfaces of the leads 412 are also exposed through the molding compound 470. FIG. 4D shows a view of a bottom side of the assembly 400 (as compared with the view of FIG. 4C). As illustrated in FIG. 4D, portions of the leadframe, such as surface of the leads 412 are exposed through the molding compound 470. As described herein, the assembly 400 can provide for dual-sided cooling (thermal dissipation) through the leadframe on a first side of the assembly 400 and through the heat slug 450 on a second side of the assembly 400.

FIG. 4E, as indicated above, illustrates a cross-sectional view of the apparatus 400 along the section line 4E-4E in FIG. 4B. As the cross-section of FIG. 4E is through the semiconductor die 420 and 424, the semiconductor die 422 and 426 are not shown in FIG. 4E. However, a cross-section thorough the semiconductor die 422 and 426 would be similar to the cross section shown in FIG. 4E.

As illustrated in FIG. 4E, the semiconductor die 420, 424 and 428 are disposed on the leadframe 410, the conductive clip 430 is disposed on the semiconductor die 420 and 424 and the leadframe 410 (e.g., on the leads 412). As further shown in FIG. 4E, the conductive clip 435 is disposed on the semiconductor die 424 and the leadframe 410 (e.g., on the leads 412) and the heat slug 450 is disposed on the conductive clips 430 and 435, with an adhesive layer 460 (e.g., epoxy, adhesive film, etc.) being disposed between the heat slug 450 and the conductive clips 430 and 435. As discussed herein, because the heat slug 450 is electrically insulative, the heat slug 450 can be disposed on (bridge) both conductive clips 430 and 435, with the conductive clips 430 and 435 remaining electrically isolated from one another. FIG. 4E also further illustrates encapsulation of the apparatus 400 by the molding compound 470, with a surface of the heat slug 450 and surfaces of the leadframe 410 being exposed through the molding compound 470.

Figure 5A:
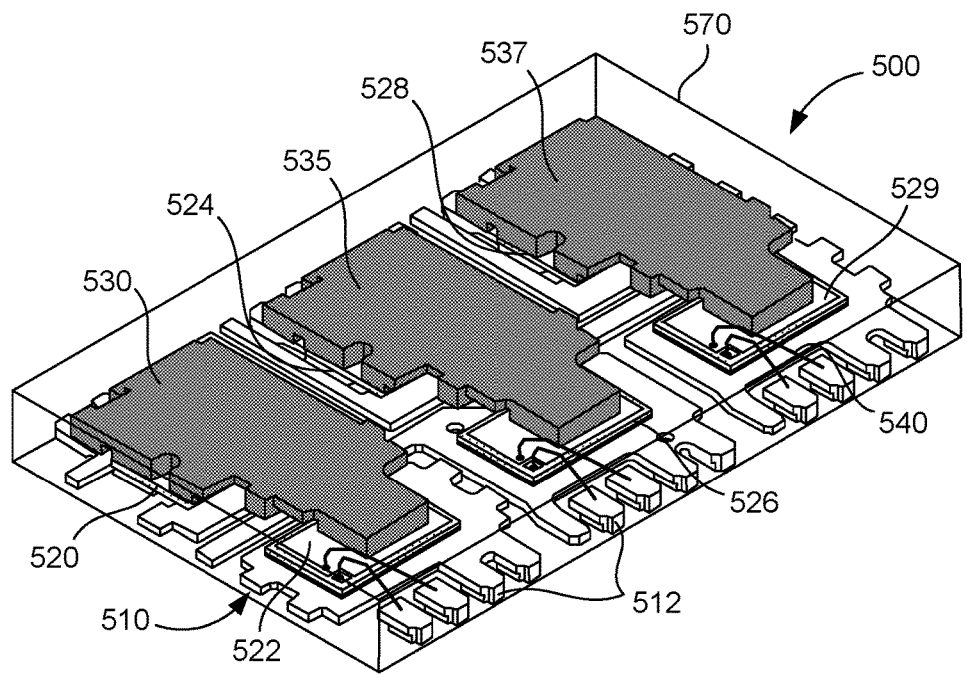
FIGS. 5A through 5E are diagrams that illustrate various views of another semiconductor device assembly.
Figure 5B:
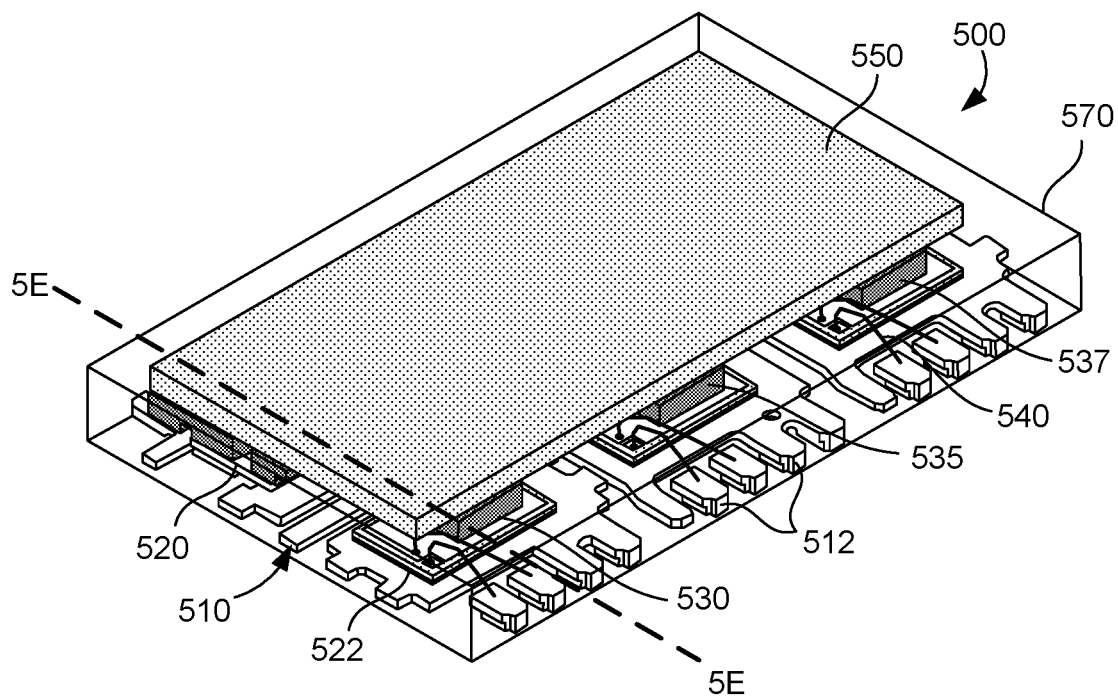
Figure 5C:
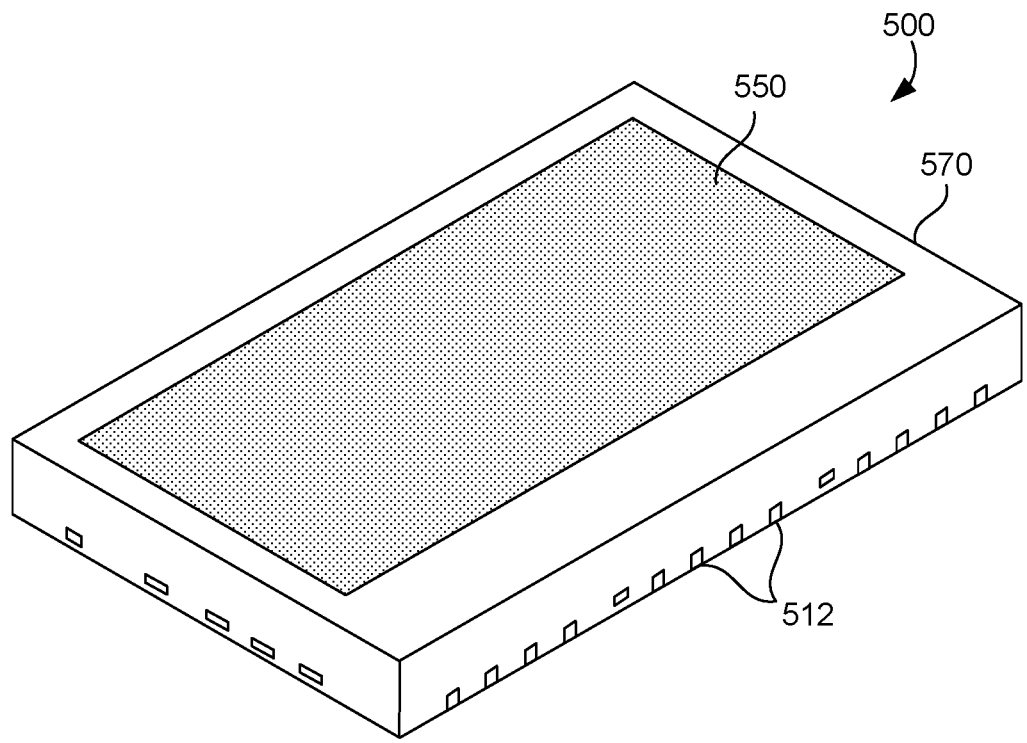
Figure 5D:
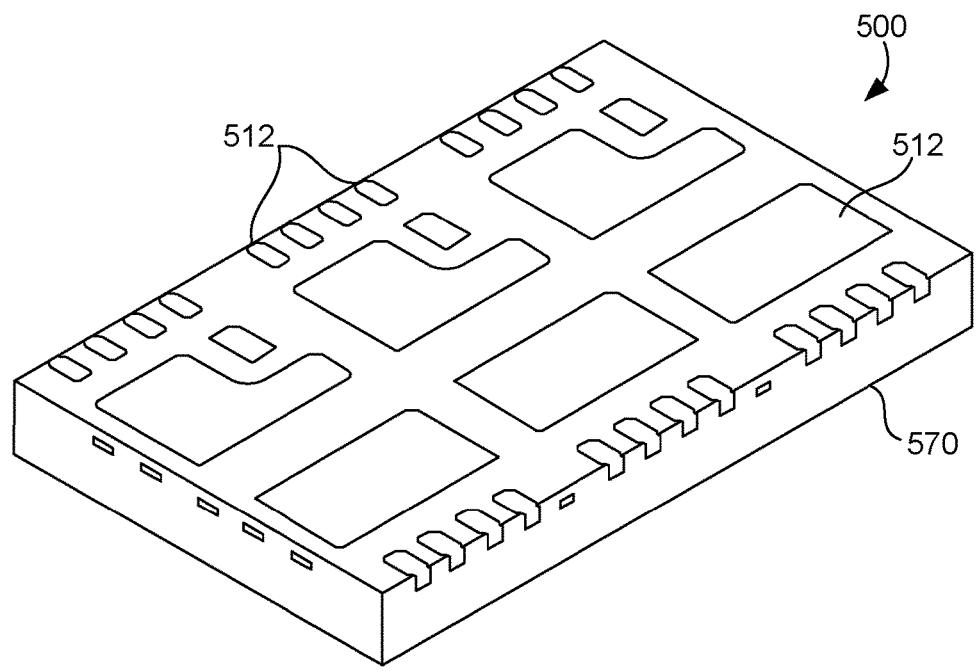
Figure 5E:
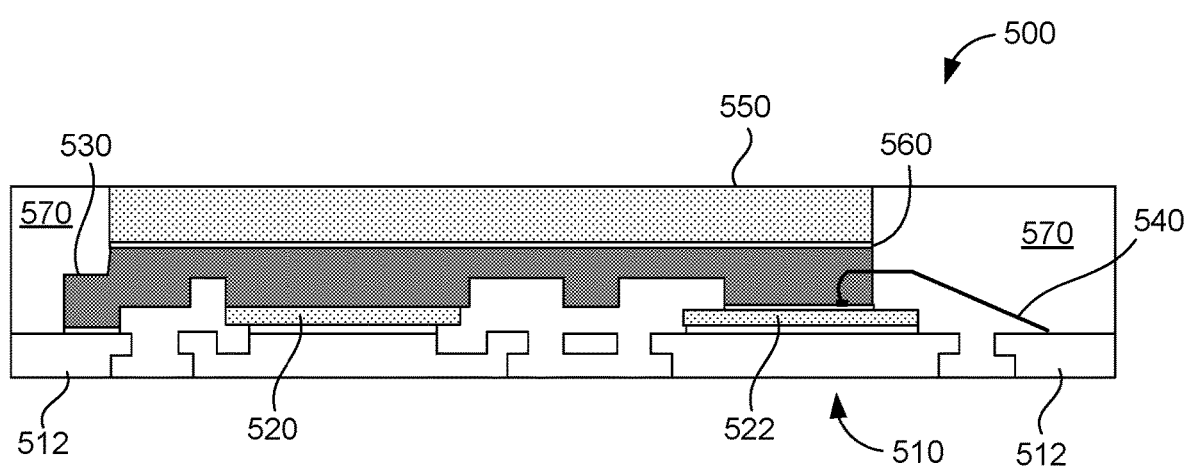

FIGS. 5A through 5E are diagrams that illustrate various views of a semiconductor device assembly 500. FIG. 5A is an isometric view of the assembly 500 without a heat slug to illustrate arrangement of elements of the assembly 500 (that are disposed under the heat slug). FIG. 5B is an isometric view of the assembly 500 with the heat slug included. As with FIGS. 2A, 2B, 3A, 3B, 4A and 4B, in FIGS. 5A and 5B, a molding compound is indicated by outline (e.g., transparent) only, so that the elements of the assembly 500 disposed within the molding compound are visible in those views. FIG. 5C is an isometric view of the assembly 500 corresponding with the view of FIG. 5B, showing the molding compound as opaque. FIG. 5D is an isometric view illustrating a bottom side of the assembly 500 shown in FIG. 5C. FIG. 5E is a cross-sectional diagram of the assembly 500 along a section line 5E-5E in FIG. 5B, with the molding compound illustrated by outline.

Referring to FIG. 5A, the assembly 500 includes a leadframe 510, semiconductor die 520, 522, 524, 526, 528 and 529, conductive clips 530, 535 and 537, wire bonds 540 and a molding compound 570. As noted above, a heat slug is not shown in FIG. 5A. The leadframe 510 can include multiple portions including a plurality of leads 512 that are configured to be coupled (electrically coupled) with a printed circuit board. As shown in FIG. 5A, the semiconductor die 520, 522, 524, 526, 528 and 529 (which can implement a multi-phase controller) can be disposed on the leadframe 510. The conductive clip 530 can be disposed on (and electrically coupled with) the leadframe 510 and the semiconductor die 520 and 522. The conductive clip 530 can provide electrical connections between the leadframe 510 and the semiconductor die 520 and 522. The conductive clip 535 can be disposed on (and electrically coupled with) the leadframe 510 and the semiconductor die 524 and 526. The conductive clip 535 can provide electrical connections between the leadframe 510 and the semiconductor die 524 and 526. The conductive clip 537 can be disposed on (and electrically coupled with) the leadframe 510 and the semiconductor die 528 and 529. The conductive clip 537 can provide electrical connections between the leadframe 510 and the semiconductor die 528 and 529. As also shown in FIG. 5A, the wire bonds 540 can also provide electrical connections between the semiconductor die 522, 526 and 529 and the leadframe 510.

As further shown in FIG. 5A, a molding compound 570 (shown in outline) can encapsulate (partially encapsulate) the apparatus 500. For instance, portions (surfaces) of the leadframe 510 (such as the leads 512) can be exposed through the molding compound 570 to provide for establishing electrical connections to the semiconductor die 520, 522, 524, 526, 528 and 529

Referring to FIG. 5B, the assembly 500 is illustrated with a thermally conductive and electrically insulative heat slug 550. In some implementations, as discussed above, the heat slug 550 can include a ceramic material. For instance, in some implementations, the heat slug 550 can include at least one of $Al_2O_3$, AN and BeO. In some implementations, the heat slug 550 can include other thermally conductive and electrically insulative materials.

As shown in FIG. 5B, the heat slug 550 can be disposed on the conductive clips 530, 535 and 437, and can extend (laterally extend) beyond the conductive clips 530, 535 and 537 over (above, vertically above, etc.) the semiconductor die 520, 522, 524, 526, 528 and 529 and one or more of the wire bonds 540, in an arrangement (vertical arrangement) such as discussed above with respect to FIG. 1. In the assembly 500, a surface (upper surface) of the heat slug 550 can be exposed through the molding compound 570. In some implementations, a heat sink (or other thermal dissipation apparatus) can be disposed on the exposed surface of the heat slug 550, as well as heat slugs of other assemblies included in a corresponding electrical system. Because the heat slug 550 is electrically insulative, the heat slug 550 is not electrically connected to the conductive clips 530, 535 and 537, preventing the risk of an electrical connection (electrical short) to the semiconductor die 520, 522, 524, 526, 528 and 529 through the heat slug 550. A section line 5E-5E is also shown in FIG. 5B, where the section line 5E-5E corresponds with the cross-sectional view of the assembly 500 shown in FIG. 5E.

Referring to FIG. 5C, the assembly 500 is illustrated with the molding compound 570 shown as opaque, as compared to the molding compound 570 being shown as transparent in FIGS. 5A and 5B. As illustrated in FIG. 5C, a surface (upper surface) of the heat slug 550 is exposed through the molding compound 570. Further, portions of the leadframe, such as surfaces of the leads 512 are also exposed through the molding compound 570. FIG. 5D shows a view of a bottom side of the assembly 500 (as compared with the view of FIG. 5C). As illustrated in FIG. 5D, portions of the leadframe, such as surface of the leads 512 are exposed through the molding compound 570. As described herein, the assembly 500 can provide for dual-sided cooling (thermal dissipation) through the leadframe on a first side of the assembly 500 and through the heat slug 550 on a second side of the assembly 500.

FIG. 5E, as indicated above, illustrates a cross-sectional view of the apparatus 500 along the section line 5E-5E in FIG. 5B. As the cross-section of FIG. 5E is through the semiconductor die 520 and 522, the semiconductor die 524, 526, 528 and 529 and the conductive clips 535 and 537 are not shown in FIG. 5E. However, a cross-section thorough the semiconductor die 524 and 526, or through the semiconductor die 528 and 529, would be similar to the cross section shown in FIG. 5E.

As illustrated in FIG. 5E, the semiconductor die 520 and 522 are disposed on the leadframe 510, the conductive clip 530 is disposed on the semiconductor die 520 and 522 and the leadframe 510 (e.g., on the leads 512). As further shown in FIG. 5E, the heat slug 550 is disposed on the conductive clip 530 (as well as the conductive clips 535 and 537, as shown in FIG. 5B), with an adhesive layer 560 (e.g., epoxy, adhesive film, etc.) being disposed between the heat slug 550 and the conductive clip 530 (and clips 535 and 537). As discussed herein, because the heat slug 550 is electrically insulative, the heat slug 550 can be disposed on (bridge) all three conductive clips 530, 535 and 437, with the conductive clips 530, 535 and 537 remaining electrically isolated from one another. FIG. 5E also further illustrates encapsulation of the apparatus 500 by the molding compound 570, with a surface of the heat slug 550 and surfaces of the leadframe 510 being exposed through the molding compound 570.

Figure 6A:
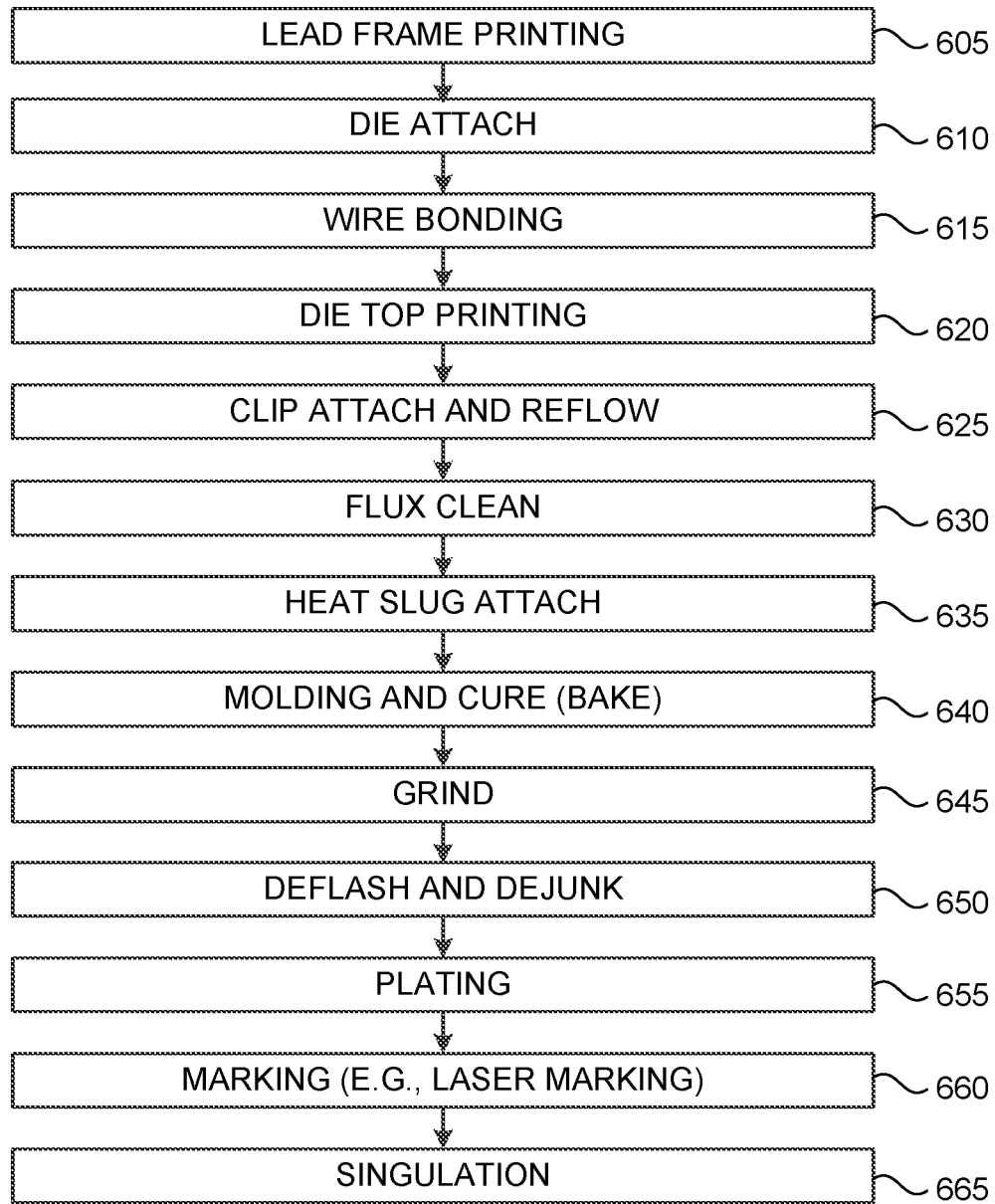
FIG. 6A is a flowchart that illustrates a method for manufacturing semiconductor device assemblies, such as those described herein.
Figure 6B:
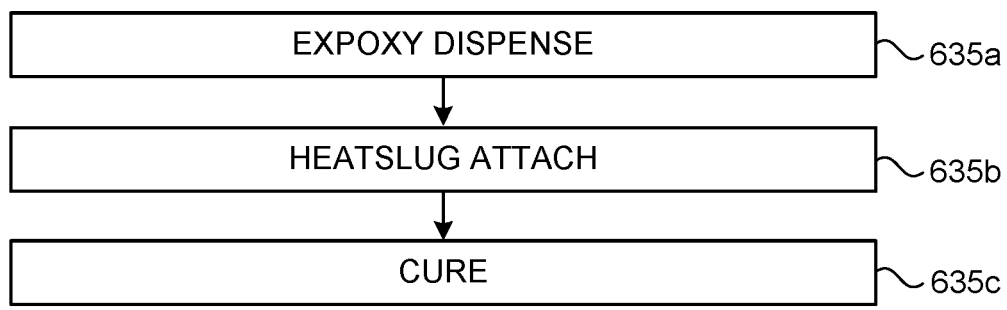
FIGS. 6B and 6C are flowcharts illustrating implementations for a heat slug attachment operation of the method of FIG. 6A.
Figure 6C:
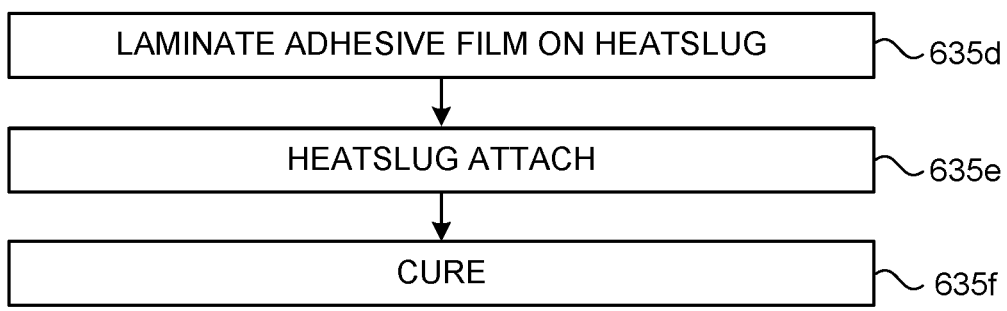

FIG. 6A is a flowchart that illustrates a method 600 for manufacturing semiconductor device assemblies, such as those described herein. FIGS. 6B and 6C are flowcharts illustrating example approaches for performing a heat slug attachment operation that can be implemented in conjunction with the method 600 of FIG. 6A (e.g., block 635 of the method 600). In the method 600, the operations shown are given by way of example and for purposes of illustration. In some implementations, the operations of the method 600 could be performed in different orders than shown in FIG. 6A, additional operations could be included, and/or operations could be eliminated.

As shown in FIG. 6A, the method 600, at block 605 includes a leadframe printing operation. Depending on the specific implementation, the leadframe printing operation at block 605 includes a solder printing operation, an adhesive printing operation, etc. The leadframe printing operation of block 605 can, for example, be used to define where connections (e.g., electrical connections) will be made between the leadframe and one or more semiconductor die of a semiconductor device assembly, such as with die attach paddles, signal leads, power terminals, etc. At block 610, the method 600 includes a die attach operation, which can be performed to attach one or more semiconductor die (e.g., thinned semiconductor die) to the leadframe with the leadframe printing material (solder, adhesive, etc.) of block 605. Depending on the leadframe printing material, the die attach operation 610 can include a solder reflow operation, a cure operation, etc. At block 615, the method 600 includes a wire bonding operation, which can be used to form wire bonds (e.g., low-loop wire bonds) between the one or more semiconductor and the leadframe, or form semiconductor die to semiconductor die wire bonds, such as in the implementations illustrated herein.

At block 620, the method 600 includes a die top printing operation, which can be a solder (or other conductive adhesive) print operation that defines where respective electrical connections will be made between the one or more semiconductor die of an assembly and one or more conductive clips of the assembly. The die top printing can also include solder (or other) printing on the leadframe, to define where respective electrical connections between the leadframe and the one or conductive clips will be formed. At block 625, a clip attach and reflow operation can be performed to couple one or more conductive clips with the leadframe and the one or more semiconductor die of a corresponding assembly. At block 630, the method 600 can include a flux clean operation to remove solder flux residue from the reflow of block 625, which can prevent undesired leakage current (through the solder flux residue) during operation of the corresponding semiconductor device assembly.

At block 635, the method 600 includes a heat slug attach operation, e.g., to attach a thermally conductive and electrically insulative heat slug to one or more conductive clips of a corresponding assembly. As noted above, FIGS. 6B and 6C, which are described in further detail below, illustrate example implementations of a heat slug attach operation.

At block 640, the method 600 can include a molding and mold cure (bake) operation to encapsulate (at least in part) a corresponding semiconductor device apparatus in a molding compound (e.g., an epoxy molding compound, etc.). In the method 600, during the molding performed at block 640, the heat slug of block 635 can be overmolded (encapsulated in the molding compound) and, at block 645, a grind operation can be performed to remove a portion of the molding compound, so as to expose a surface of the heat slug, such as in the example implementations illustrated herein.

At block 650 a deflash and dejunk operation can be performed to clean up (remove) unwanted (excess, etc.) molding compound from a corresponding assembly, which such unwanted molding compound can be an artifact of the molding operation of block 640. At block 655 of the method 600, a plating operation is performed to plate (e.g., solder plate) exposed portions (e.g., leads, signal lead, power terminals, etc.) of a leadframe of a corresponding assembly. At block 660, the method 600 includes performing a marking operation (e.g., laser marking), such as to mark a part identifier in the molding compound. At block 665, the method 600 includes device singulation, which can be performed to separate individual semiconductor assemblies from one another, e.g., when a strip, or matrix of leadframes is used to concurrently produce a plurality of individual semiconductor device assemblies with the method 600.

FIG. 6B is a flowchart illustrating an example implementation of the heat slug attach operation of block 635 in FIG. 6A. As shown in FIG. 6B, at block 635a, an epoxy dispense operation is performed. For instance, silver (Ag) epoxy can be dispensed on a surface of (surfaces of) on one or more conductive clips (from block 625) of a device assembly. At block 635b, a thermally conductive and electrically insulative heat slug can be attached to (disposed on) the one or more conductive clips (e.g., on the epoxy) and, at block 635c, a cure operation can be performed to cure the epoxy of block 635a to couple the heat slug to the one or more conductive clips.

FIG. 6C is a flowchart illustrating another example implementation of the heat slug attach operation of block 635 in FIG. 6A. As shown in FIG. 6C, at block 635d, an adhesive film (e.g., a film-on-wire film) can be laminated on a thermally conductive and electrically insulative heat slug. At block 635e, the heat slug can be attached to (disposed on) the one or more conductive clips with the adhesive film disposed between the heat slug and the one or more conductive clips. At block 635f, a cure operation can be performed to cure the adhesive film of block 635d to couple the heat slug to the one or more conductive clips with the adhesive film. As a result of the cure operation of block 635f, at least a portion of one or more wire bonds (of block 615) can be embedded in the cured adhesive film, such as described herein.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus comprising:
a leadframe including a plurality of leads configured to provide electrical connections for the apparatus;
a semiconductor die disposed on the leadframe;
a conductive clip electrically coupling the semiconductor die with the leadframe;
a heat slug disposed on the conductive clip, the heat slug including a thermally conductive and electrically insulative material;
a wire bond electrically coupling the semiconductor die with a lead of the plurality of leads of the leadframe; and
an adhesive layer coupling the heat slug with the conductive clip, at least a portion of the wire bond being disposed within the adhesive layer.

2. The apparatus of claim 1, wherein the thermally conductive and electrically insulative material is a ceramic material.

3. The apparatus of claim 2, wherein the ceramic material includes at least one of aluminum oxide, aluminum nitride and beryllium oxide.

4. The apparatus of claim 1, wherein the thermally conductive and electrically insulative material includes at least one of silicon, silicon carbide and diamond.

5. The apparatus of claim 1, wherein the wire bond is a low-loop wire bond.

6. The apparatus of claim 1, wherein:
the semiconductor die is arranged in a plane; and
a line orthogonal to the plane intersects the leadframe, the semiconductor die, the wire bond and the heat slug.

7. The apparatus of claim 1, wherein the conductive clip is a first conductive clip, the apparatus further comprising:
a second conductive clip electrically coupling the semiconductor die with the leadframe, the heat slug being further disposed on the second conductive clip.

8. The apparatus of claim 1, wherein the semiconductor die is a first semiconductor die and the conductive clip is a first conductive clip, the apparatus further comprising:
a second semiconductor die disposed on the leadframe; and
a second conductive clip electrically coupling the second semiconductor die with the leadframe, the heat slug being further disposed on the second conductive clip.

9. The apparatus of claim 8, further comprising:
a third semiconductor die disposed on the leadframe; and
a third conductive clip electrically coupling the third semiconductor die with the leadframe, the heat slug being further disposed on the third conductive clip.

10. The apparatus of claim 1, further comprising a molding compound at least partially encapsulating the apparatus, a surface of the heat slug being exposed through the molding compound.

11. The apparatus of claim 1, wherein the semiconductor die is a first semiconductor die, the apparatus further comprising:
a second semiconductor die disposed on the leadframe; and
a wire bond electrically coupling the second semiconductor die with a lead of the plurality of leads of the leadframe, and the second semiconductor die being arranged in a plane, and a line orthogonal to the plane intersects the leadframe, the second semiconductor die, the wire bond and the heat slug.

12. The apparatus of claim 11, further comprising an adhesive film coupling the heat slug with the conductive clip, at least a portion of the wire bond being disposed within the adhesive film.

13. The apparatus of claim 1, wherein the semiconductor die is a first semiconductor die, the apparatus further comprising a second semiconductor die disposed on the leadframe, the conductive clip electrically coupling the second semiconductor die with the first semiconductor die and the leadframe.

14. An apparatus comprising:
a leadframe including a plurality of leads configured to provide electrical connections for the apparatus;
a semiconductor die disposed on the leadframe;
a first conductive clip electrically coupling the semiconductor die with the leadframe;
a second conductive clip electrically coupling the semiconductor die with the leadframe;
a wire bond electrically coupling the semiconductor die with a lead of the plurality of leads of the leadframe; and
a heat slug disposed on the first conductive clip and the second conductive clip, the heat slug including a thermally conductive and electrically insulative material,
the semiconductor die being arranged in a plane; a line orthogonal to the plane intersecting the leadframe, the semiconductor die, the wire bond and the heat slug.

15. The apparatus of claim 14, wherein the line is a first line, a second line orthogonal to the plane intersecting the leadframe, the semiconductor die, the first conductive clip and the heat slug.

16. The apparatus of claim 14, wherein the thermally conductive and electrically insulative material is a ceramic material.

17. The apparatus of claim 14, further comprising an epoxy material coupling the heat slug with the first conductive clip and the second conductive clip.

18. The apparatus of claim 14, further comprising an adhesive film coupling the heat slug with the first conductive clip and the second conductive clip, at least a portion of the wire bond being disposed within the adhesive film.

19. An apparatus comprising:
a leadframe including a plurality of leads configured to provide electrical connections for the apparatus;
a first semiconductor die disposed on the leadframe;
a second semiconductor die disposed on the leadframe;
a conductive clip electrically coupling the first semiconductor die with the second semiconductor die and the leadframe;
a heat slug disposed on the conductive clip, the heat slug including a thermally conductive and electrically insulative material;
a third semiconductor die disposed on the leadframe; and
a wire bond electrically coupling the third semiconductor die with a lead of the plurality of leads of the leadframe,
the third semiconductor die being arranged in a plane, a line orthogonal to the plane intersecting the leadframe, the third semiconductor die, the wire bond and the heat slug.

20. An apparatus comprising:
a leadframe including a plurality of leads configured to provide electrical connections for the apparatus;
a first semiconductor die disposed on the leadframe;
a second semiconductor die disposed on the leadframe;
a first conductive clip electrically coupling the first semiconductor die with the second semiconductor die and the leadframe;
a third semiconductor die disposed on the leadframe;
a fourth semiconductor die disposed on the leadframe;
a second conductive clip electrically coupling the third semiconductor die with the fourth semiconductor die and the leadframe; and
a heat slug disposed on the first conductive clip and the second conductive clip, the heat slug including a thermally conductive and electrically insulative material.

21. The apparatus of claim 20, further comprising:
a fifth semiconductor die disposed on the leadframe; and
a wire bond electrically coupling the fifth semiconductor die with a lead of the plurality of leads of the leadframe,
the fifth semiconductor die being arranged in a plane, a line orthogonal to the plane intersecting the leadframe, the fifth semiconductor die, the wire bond and the heat slug.

22. The apparatus of claim 20, further comprising:
a fifth semiconductor die disposed on the leadframe;
a sixth semiconductor die disposed on the leadframe; and
a third conductive clip electrically coupling the fifth semiconductor die with the sixth semiconductor die and the leadframe,
the heat slug being further disposed on the third conductive clip.

* * * * *